United States Patent
Chung et al.

(10) Patent No.: US 11,672,108 B2
(45) Date of Patent: Jun. 6, 2023

(54) METHOD FOR MANUFACTURING ELECTROMAGNETIC SHIELDING FILM

(71) Applicant: Zhen Ding Technology Co., Ltd., Taoyuan (TW)

(72) Inventors: Sheng-Feng Chung, Taoyuan (TW); Chi-Fei Huang, Taoyuan (TW); Chen-Feng Yen, Taoyuan (TW)

(73) Assignee: Zhen Ding Technology Co., Ltd., Taoyuan (TW)

( * ) Notice: Subject to any disclaimer, the term of this patent is extended or adjusted under 35 U.S.C. 154(b) by 312 days.

(21) Appl. No.: 16/996,705

(22) Filed: Aug. 18, 2020

(65) Prior Publication Data

US 2022/0039303 A1    Feb. 3, 2022

(30) Foreign Application Priority Data

Jul. 28, 2020 (CN) .......................... 202010740648.8

(51) Int. Cl.
*H05K 9/00* (2006.01)
*B41M 3/00* (2006.01)
*B41M 7/00* (2006.01)
*C09D 11/102* (2014.01)
*C09D 11/322* (2014.01)
*C09D 11/36* (2014.01)
*C09D 11/037* (2014.01)
*C09D 11/033* (2014.01)
(Continued)

(52) U.S. Cl.
CPC .......... *H05K 9/0092* (2013.01); *B41M 3/006* (2013.01); *B41M 7/009* (2013.01); *B41M 7/0081* (2013.01); *C09D 11/033* (2013.01); *C09D 11/037* (2013.01); *C09D 11/102* (2013.01); *C09D 11/322* (2013.01); *C09D 11/36* (2013.01); *C09D 11/52* (2013.01); *B05D 1/26* (2013.01); *B05D 1/36* (2013.01); *B05D 1/38* (2013.01); *B05D 3/065* (2013.01); *B05D 3/067* (2013.01); *B05D 7/52* (2013.01)

(58) Field of Classification Search
CPC ... B05D 1/26; B05D 1/36; B05D 1/38; B05D 3/065; B05D 3/067; B05D 7/52; H05K 9/0092; B41M 7/0081; B41M 7/009; C09D 11/033; C09D 11/037; C09D 11/102; C09D 11/322; C09D 11/36; C09D 11/52
USPC .......................................................... 427/511
See application file for complete search history.

(56) References Cited

U.S. PATENT DOCUMENTS

| | | | |
|---|---|---|---|
| 11,291,144 B2* | 3/2022 | Lee | H05K 9/0039 |
| 2008/0200333 A1* | 8/2008 | Gotou | B32B 15/08 |
| | | | 503/225 |

(Continued)

FOREIGN PATENT DOCUMENTS

| | | | | |
|---|---|---|---|---|
| CN | 101401206 A | 4/2009 | | |
| WO | WO-2018147302 A1 * | 8/2018 | ............ | B32B 15/08 |
| WO | WO-2019035697 A1 * | 8/2018 | ............... | H05K 9/00 |

*Primary Examiner* — Brian K Talbot
(74) *Attorney, Agent, or Firm* — ScienBiziP, P.C.

(57) ABSTRACT

A method for manufacturing an electromagnetic shielding film of reduced thickness and a simplified manufacturing process includes forming a conductive ink layer by inkjet printing, on a component to be shielded, forming an insulative ink layer on the conductive ink layer by inkjet printing, and sintering the conductive ink layer and the insulative ink layer to form an electromagnetic shielding layer and an insulative layer, thereby obtaining the electromagnetic shielding film.

10 Claims, 3 Drawing Sheets

(51) Int. Cl.
*C09D 11/52* (2014.01)
*B05D 1/38* (2006.01)
*B05D 1/26* (2006.01)
*B05D 3/06* (2006.01)
*B05D 7/00* (2006.01)
*B05D 1/36* (2006.01)

(56) References Cited

U.S. PATENT DOCUMENTS

| | | | |
|---|---|---|---|
| 2009/0184882 A1* | 7/2009 | Jow | H01Q 1/40 343/873 |
| 2013/0056258 A1* | 3/2013 | Zhang | C09J 7/29 174/388 |
| 2015/0156930 A1* | 6/2015 | Huang | H05K 9/0088 428/596 |
| 2020/0128704 A1* | 4/2020 | Liu | H05K 1/0216 |
| 2020/0315035 A1* | 10/2020 | Shabtai | B33Y 50/02 |

* cited by examiner

METHOD FOR MANUFACTURING ELECTROMAGNETIC SHIELDING FILM

FIELD

The subject matter herein generally relates to electromagnetic shielding, in particular to a method for manufacturing an electromagnetic shielding film.

BACKGROUND

Electromagnetic interference may arise from external devices, and the external devices may be affected or interfered with by the local device. Electromagnetic shielding or the lack of it is an indicator of product quality. Portable terminal devices such as smart phones require better and better shielding against ultrahigh frequency (UHF) signals (1 GHz to 50 GHz). Such shielding is usually through the use of electromagnetic shielding films installed in electronic devices.

An electromagnetic shielding film can comprise a metal layer, a glue layer, and a protective layer. The metal layer is a metal foil or a metal film which is formed by a sputtering process. The manufacturing of such electromagnetic shielding film is complicated, and manufacturing cost is high.

BRIEF DESCRIPTION OF THE DRAWINGS

Implementations of the present technology will now be described, by way of embodiment, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments.

One embodiment of a method for manufacturing an electromagnetic shielding film includes steps of:

S1, forming a conductive ink layer by inkjet printing of a conductive ink;

S2, forming an insulative ink layer on the conductive ink layer by inkjet printing of an insulative ink; and S3, sintering the conductive ink layer and the insulative ink layer to form an electromagnetic shielding layer and an insulative layer, to obtain the electromagnetic shielding film.

Figure 1:
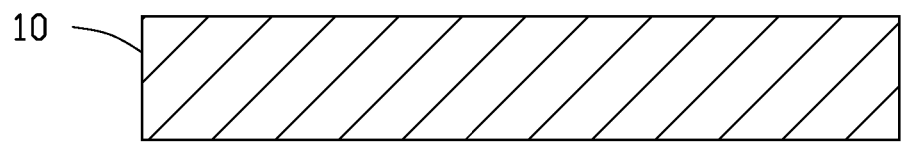
FIG. 1 is a cross-sectional view of an embodiment of a conductive ink layer.

Referring to FIG. 1, in step S1, the conductive ink layer 10 is formed by inkjet printing of the conductive ink.

The conductive ink includes electromagnetic shielding nanoparticles with a mass percentage of 5% to 50%, a directing agent with a mass percentage of 0.1% to 3%, a reductant with a mass percentage of 0.1% to 3%, a binder with a mass percentage of 0.1% to 5%, an antifreeze with a mass percentage of 0.1% to 5%, a dispersant with a mass percentage of 0.1% to 5%, a silicon surface additive with a mass percentage of 0.1% to 1%, an adhesion promoter with a mass percentage of 0.1% to 1%, and a solvent with a mass percentage of 32% to 95%.

The electromagnetic shielding nanoparticles prevent electromagnetic interference affecting a shielded component. In one embodiment, the electromagnetic shielding nanoparticles are metal particles, which include one or more of silver, copper, gold, nickel, palladium, chromium, platinum, and cobalt. According to some embodiments, the electromagnetic shielding nanoparticles may include graphite, carbon black, carbon nanotubes, carbon nanospheres, carbon fibers, nickel-plated graphite, and the like.

The directing agent directs the electromagnetic shielding nanoparticles. The directing agent may be any directing agent suitable for conductive inks known in the field. The directing agent includes, but is not limited to, poly(ethyleneoxide)-poly(propyleneoxide)-poly(ethyleneoxide) (PEO-PPO-PEO). In one embodiment, the directing agent is PLURONICS®F127.

The reductant reduces metal ions to metal atoms. The reductant may be any reductant suitable for conductive inks known in the field. The reductant includes, but is not limited to, hydrazine hydrate, sodium borohydride, ascorbic acid, or hydroiodic acid. In one embodiment, the reductant is ascorbic acid.

The binder provides bonding between the electromagnetic shielding nanoparticles and gives adhesion to the conductive ink layer 10. The binder may be any binder suitable for conductive inks known in the field. The binder includes, but is not limited to, acrylic adhesives or polyvinylpyrrolidone adhesives. In one embodiment, the binder is polyvinylpyrrolidone adhesives.

The antifreeze improves resistance to freezing of the conductive ink. The antifreeze may be any antifreeze suitable for conductive inks known in the field. The antifreeze includes, but is not limited to, zinc sulfate, ferrous sulfate, calcium nitrate, magnesium nitrate, melatonin, pentaerythritol, glycerin, propylene glycol, glycerol, ethylene glycol, or urea. In one embodiment, the antifreeze is ethylene glycol.

The dispersant facilitates uniform dispersion of the electromagnetic shielding nanoparticles in the solvent. The dispersant may be any dispersant suitable for conductive inks known in the field. The dispersant includes, but is not limited to, hydrolyzed polymaleic anhydride, polyethylene glycol, or polyethylene wax. In one embodiment, the dispersant is polyethylene glycol.

The silicon surface additive changes surface tension of the conductive ink. The conductive ink may include a hydrophobic monomer, a hydrophobic organic solvent, acetylene glycol, isopropanol, or other surface tension adjusters.

The adhesion promoter may be any adhesion promoter suitable for conductive inks known in the field. The adhesion promoter includes, but is not limited to, aminosilane or epoxy phosphate. In one embodiment, the adhesion promoter is epoxy phosphate.

The solvent includes one or more of deionized water, ethanol, ethylene glycol, glycerol, isopropanol, n-butanol, and butanediol. In one embodiment, the solvent is n-butanol.

A viscosity of the conductive ink is 5~30 cps, and a surface tension of the conductive ink is 30-50 dyn/cm. The conductive ink is suitable for inkjet printing.

In step S1, while forming the conductive ink layer, the conductive ink layer is cured. The insulative ink layer is formed on the conductive ink layer when cured. According to some embodiments, the step of curing the conductive ink layer may be performed after the step of forming the conductive ink layer.

The conductive ink layer may be cured by infrared light irradiation or ultraviolet light irradiation. A curing temperature is 150~250° C., and a drying time is less than 5 seconds.

Figure 2:
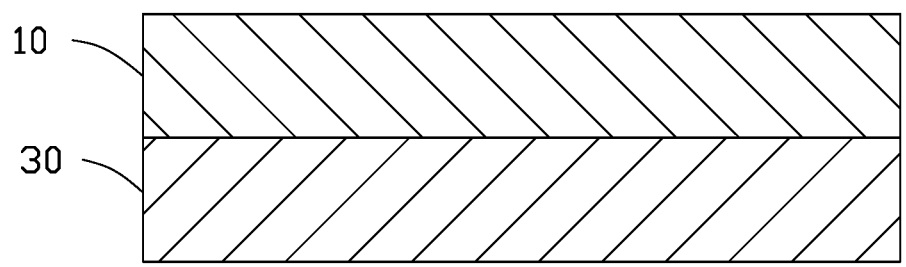
FIG. 2 is a cross-sectional view showing an insulative ink layer formed on the conductive ink layer of FIG. 1.

Referring to FIG. 2, in step S2, the insulative ink layer 30 is formed by inkjet printing of the insulative ink.

The insulative ink includes carbon black with a mass percentage of 3% to 25%, a thermosetting resin with a mass percentage of 3% to 15%, a flexible resin with a mass percentage of 3% to 5%, a hardener with a mass percentage of 0.5% to 5%, surface tension adjuster with a mass percentage of 0.1% to 1%, an adhesive promoter with a mass percentage of 0.1% to 1%, and a solvent with a mass percentage of 38% to 91%.

The carbon black is used to add color. According to some embodiments, materials of other colors can also be used.

The thermosetting resin may be any thermosetting resin known in the field. The thermosetting resin includes, but is not limited to, one or more of epoxy resin, polyimide, polyurethane, acrylic, phenolic resin, and silica gel. In one embodiment, the thermosetting resin is epoxy resin.

The flexible resin may be any flexible resin known in the field. In one embodiment, the flexible resin is nitrile rubber.

The hardener may be any hardener known in the field. In one embodiment, the hardener is an imidazole hardener.

The surface tension adjuster of the insulative ink changes the surface tension of the insulative ink. The surface tension adjuster may be any surface tension adjuster suitable for insulative ink known in the field. The surface tension adjuster includes, but is not limited to, aminosilane or epoxy phosphate. In one embodiment, the surface tension adjuster of the insulative ink is epoxy phosphate.

The solvent of the insulative ink includes one or more of deionized water, ethanol, ethylene glycol, glycerol, isopropanol, n-butanol, and butanediol. In one embodiment, the solvent of the insulative ink is ethanol.

In step S2, while forming the insulative ink layer, the insulative ink layer is cured. The insulative ink layer may be cured by infrared light irradiation or ultraviolet light irradiation. A curing temperature is 150~250° C., and a drying time is less than 5 seconds. According to some embodiments, the step of curing the insulative ink layer may be performed after the step of forming the insulative ink layer.

Figure 3:
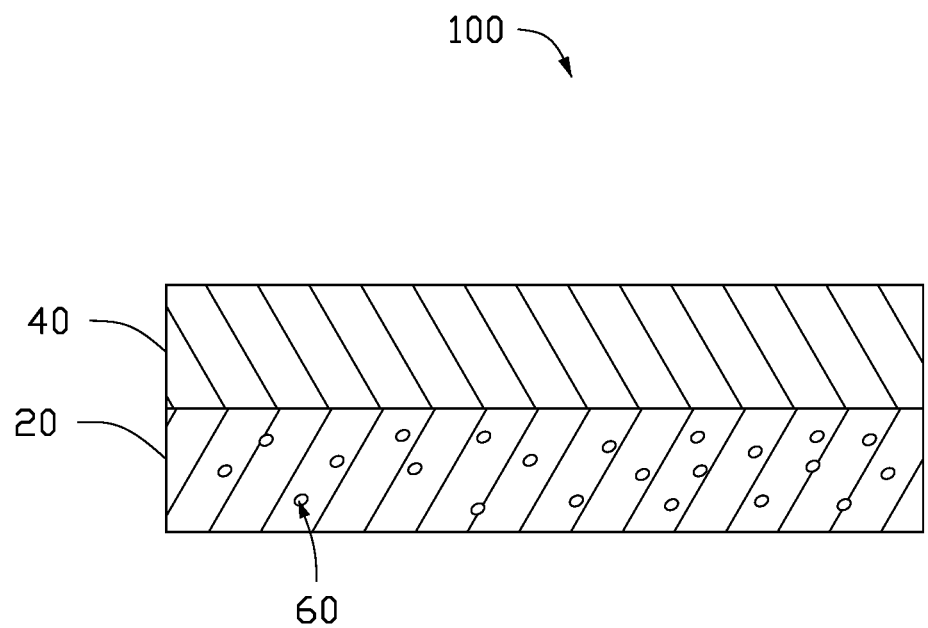
FIG. 3 is a cross-sectional view of an embodiment of an electromagnetic shielding film.

Referring to FIGS. 2 and 3, in step S3, the conductive ink layer 10 and the insulative ink layer 30 are sintered to form the electromagnetic shielding layer 20 and the insulative layer 40, thereby obtaining the electromagnetic shielding film 100.

The conductive ink layer 10 is sintered to form the electromagnetic shielding layer 20. A sintering temperature is 150~200° C., and a sintering time is 30~60 minutes. During sintering, the heat causes the electromagnetic shielding nanoparticles in the conductive ink layer 10 to aggregate and become connected.

When sintering the conductive ink layer 10, the solvent within the conductive ink layer 10 vaporizes to form a plurality of micropores 60, therefore the electromagnetic shielding layer 20 includes the micropores 60. The micropores 60 facilitate the dissipation of water vapor within the shielded component.

The insulative ink layer 30 is sintered to form the insulative layer 40. A sintering temperature is 150~200° C. During sintering, the epoxy resin and nitrile rubber within the insulative ink layer 30 are completely cross-linked and cured to form the insulative layer 40. The insulative layer 40 protects the electromagnetic shielding layer 20.

In one embodiment, after the insulative ink layer 30 is formed, the conductive ink layer 10 and the insulative ink layer 30 are sintered simultaneously to form the electromagnetic shielding layer 20 and the insulative layer 40. According to some embodiments, the conductive ink layer 10 and the insulative ink layer 30 may be sintered separately. For example, after the conductive ink layer 10 is formed, the conductive ink layer 10 is immediately sintered to form the electromagnetic shielding layer 20, and the insulative ink layer 30 formed on the electromagnetic shielding layer 20. After the insulative ink layer 30 is formed, the insulative ink layer 30 is immediately sintered to form the insulating layer 40.

The following table (Table 1) shows three examples of the conductive ink and the insulative ink that have been tested to meet the goals described above.

TABLE 1

|  |  | Example 1 | Example 2 | Example 3 |
|---|---|---|---|---|
| Conductive ink | Silver | 28 wt % | 25 wt % | 35 wt % |
|  | Butanol | 60 wt % | 63 wt % | 45 wt % |
|  | Ascorbic acid | 2 wt % | 2 wt % | 5 wt % |
|  | Ethylene glycol | 3 wt % | 3 wt % | 5 wt % |
|  | Polyethylene glycol | 3 wt % | 3 wt % | 5 wt % |
|  | Polyvinylpyrrolidone | 2 wt % | 2 wt % | 2 wt % |
|  | PEO-PPO-PEO | 1 wt % | 1 wt % | 2 wt % |
|  | Silicone additive | 0.5 wt % | 0.5 wt % | 0.5 wt % |
|  | Epoxy phosphate | 0.5 wt % | 0.5 wt % | 0.5 wt % |
| Insulative ink | Carbon black | 15 wt % | 10 wt % | 25 wt % |
|  | Ethanol | 65 wt % | 70 wt % | 60 wt % |
|  | Epoxy resin | 10 wt % | 10 wt % | 8 wt % |
|  | Nitrile rubber | 8 wt % | 8 wt % | 5.5 wt % |
|  | Imidazole | 1 wt % | 1 wt % | 0.5 wt % |
|  | Silicone additive | 0.5 wt % | 0.5 wt % | 0.5 wt % |
|  | Epoxy phosphate | 0.5 wt % | 0.5 wt % | 0.5 wt % |

The silver, the butanol, the ascorbic acid, the ethylene glycol, the polyethylene glycol, the polyvinylpyrrolidone, the PEO-PPO-PEO, the silicone additive, and the epoxy phosphate are mixed and dissolved in n-butanol to form the conductive ink. The carbon black, the ethanol, the epoxy resin, the nitrile rubber, the imidazole, the silicone additive, and the epoxy phosphate are mixed and dissolved in ethyl alcohol to form the insulative ink.

To satisfy the ranges of the proportions of each component, the stated weights of the example can be adjusted, and are not limited thereto.

A total thickness of the electromagnetic shielding layer 20 and the insulative layer 40 is less than 10 μm, a thickness of the electromagnetic shielding layer is 0.05~3 μm, and a thickness of the insulative layer is 1~9.9 μm. A shielding effect of the electromagnetic shielding layer 20 is 60~70 dB. The electromagnetic shielding layer 20 is resistant to acid, alkali, and alcohol. The electromagnetic shielding layer 20 has good adhesion and flex-tolerance.

In the method for manufacturing the electromagnetic shielding film 100, the electromagnetic shielding layer 20 and the insulative layer 40 are directly formed on the component to be shielded by inkjet printing, the process is simple and the manufacturing cost is low. Moreover, the electromagnetic shielding film 100 produced only includes two layers in the structure, these being the electromagnetic shielding layer 20 and the insulative layer 40, which is beneficial to the thinning of the electromagnetic shielding film 100.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A method for manufacturing an electromagnetic shielding film comprising:

forming a conductive ink layer by inkjet printing of a conductive ink, the conductive ink comprising electromagnetic shielding nanoparticles, polyethylene oxide-polypropylene oxide-polyethylene oxide, and polyvinylpyrrolidone;

forming an insulative ink layer on the conductive ink layer by inkjet printing of an insulative ink; and sintering the conductive ink layer to form an electromagnetic shielding layer with a plurality of micropores; and sintering the insulative ink layer to form an insulative layer, thereby obtaining the electromagnetic shielding film.

2. The method of claim 1, wherein the conductive ink layer is formed by simultaneously inkjet printing the conductive ink and curing, the insulative ink layer is cured while forming the insulative ink layer formed by simultaneously inkjet printing the insulative ink and curing.

3. The method of claim 2, wherein the conductive ink layer and the insulative ink layer are cured by infrared light irradiation or ultraviolet light irradiation.

4. The method of claim 1, wherein the conductive ink layer and the insulative ink layer are sintered simultaneously after the insulative ink layer is formed.

5. The method of claim 1, wherein a total thickness of the electromagnetic shielding layer and the insulative layer is less than 10 μm, a thickness of the electromagnetic shielding layer is 0.05~3 μm, and a thickness of the insulative layer is 1~9.9 μm.

6. The method of claim 1, wherein the conductive ink comprises the electromagnetic shielding nanoparticles with a mass percentage of 5% to 50%, the polyethylene oxide-polypropylene oxide-polyethylene oxide with a mass percentage of 0.1% to 3%, a reductant with a mass percentage of 0.1% to 3%, the polyvinylpyrrolidone with a mass percentage of 0.1% to 5%, an antifreeze with a mass percentage of 0.1% to 5%, a dispersant with a mass percentage of 0.1% to 5%, a silicon surface additive with a mass percentage of 0.1% to 1%, an adhesion promoter with a mass percentage of 0.1% to 1%, and a solvent with a mass percentage of 32% to 95%.

7. The method of claim 6, wherein the electromagnetic shielding nanoparticles comprises one or more of silver, copper, gold, nickel, palladium, chromium, platinum, and cobalt.

8. The method of claim 6, wherein a viscosity of the conductive ink is 5~30 cps, and a surface tension of the conductive ink is 30-50 dyn/cm.

9. The method of claim 1, wherein the insulative ink comprises carbon black with a mass percentage of 3% to 25%, a thermosetting resin with a mass percentage of 3% to 15%, a flexible resin with a mass percentage of 3% to 5%, a hardener with a mass percentage of 0.5% to 5%, surface tension adjuster with a mass percentage of 0.1% to 1%, an adhesive promoter with a mass percentage of 0.1% to 1%, and a solvent with a mass percentage of 38% to 91%.

10. The method of claim 9, wherein the thermosetting resin comprises one or more of epoxy resin, polyimide, polyurethane, acrylic, phenolic resin, and silica gel.

* * * * *